(12) United States Patent
McCarroll

(10) Patent No.: US 7,667,498 B1
(45) Date of Patent: *Feb. 23, 2010

(54) RELATIVELY LOW STANDBY POWER

(75) Inventor: David W. McCarroll, Florissant, CO (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 12/288,754

(22) Filed: Oct. 23, 2008

Related U.S. Application Data

(63) Continuation of application No. 11/132,618, filed on May 18, 2005, now Pat. No. 7,443,205, which is a continuation-in-part of application No. 11/026,530, filed on Dec. 31, 2004, now abandoned.

(51) Int. Cl.
H03K 19/096 (2006.01)
(52) U.S. Cl. .............................. 326/95; 326/93; 326/98
(58) Field of Classification Search ............. 326/93–98; 327/202–203, 208–212
See application file for complete search history.

(56) References Cited

U.S. PATENT DOCUMENTS

| | | | |
|---|---|---|---|
| 5,764,566 A | 6/1998 | Akamatsu et al. | |
| 6,281,711 B1 | 8/2001 | Horiguchi et al. | |
| 6,404,254 B2 | 6/2002 | Iwaki et al. | |
| 6,639,827 B2 | 10/2003 | Clark et al. | |
| 6,775,180 B2 | 8/2004 | Biyani et al. | |
| 6,788,122 B2 | 9/2004 | Jones | |
| 7,069,522 B1 * | 6/2006 | Sluss et al. ..................... | 716/1 |
| 7,170,327 B2 | 1/2007 | Aksamit | |
| 2004/0266092 A1 * | 12/2004 | Aksamit ..................... | 438/222 |

OTHER PUBLICATIONS

USPTO Non-Final Office Action mailed Nov. 9, 2006 for U.S. Appl. No. 11/132,618, filed May 18, 2005.
Amendment filed Feb. 5, 2007 in response to USPTO Non-Final Office Action mailed Nov. 9, 2006 for U.S. Appl. No. 11/132,618, filed May 18, 2005.
USPTO Final Office Action mailed May 2, 2007 for U.S. Appl. No. 11/132,618, filed May 18, 2005.
Amendment and Petition for Extension of Time filed Aug. 13, 2007 in response to USPTO Final Office Action mailed May 2, 2007 for U.S. Appl. No. 11/132,618, filed May 18, 2005.

(Continued)

Primary Examiner—Anh Q Tran

(57) ABSTRACT

A circuit includes a first transistor stack that receives an input signal, a voltage reference, a reference potential, a clock signal and an inverted clock signal, and generates an output signal that is an inverse of the input signal. A first inverter receives the output signal from the first transistor stack. A second transistor stack receives the voltage reference, the reference potential, the clock signal and the inverted clock signal, and generates an output signal that is an inverse of an output signal from the first inverter. A pass control circuit includes first and second transistors. The first terminals of the first and second transistors are coupled together and receive the output signal of the second transistor stack, control terminals of the first and second transistors receive the clock signal and the inverted clock signal, respectively, and second terminals of the first and second transistors are coupled together and output the output signal of the second transistor stack.

10 Claims, 5 Drawing Sheets

OTHER PUBLICATIONS

USPTO Advisory Action mailed Aug. 30, 2007 for U.S. Appl. No. 11/132,618, filed May 18, 2005.
Preliminary Amendment and Petition for Extension of Time filed Sep. 20, 2007 in response to USPTO Advisory Action mailed Aug. 30, 2007 for U.S. Appl. No. 11/132,618, filed May 18, 2005.
USPTO Non-Final Office Action mailed Dec. 10, 2007 for U.S. Appl. No. 11/132,618, filed May 18, 2005.
Amendment and Petition for Extension of Time filed Apr. 10, 2008 in response to USPTO Non-Final Office Action mailed Dec. 10, 2007 for U.S. Appl. No. 11/132,618, filed May 18, 2005.

* cited by examiner

US 7,667,498 B1

RELATIVELY LOW STANDBY POWER

RELATED APPLICATIONS

The present application is a continuation of U.S. patent application Ser. No. 11/132,618, filed May 18, 2005, which is a continuation-in-part of U.S. patent application Ser. No. 11/026,530, filed Dec. 31, 2004. The disclosures of the above applications are incorporated herein by reference in their entirety.

TECHNICAL FIELD

Embodiments of the invention relate to integrated circuitry. More particularly, embodiments of the invention relate to mechanisms and techniques for selectively placing circuit components in a relatively low power state.

BACKGROUND

As more functionality is embedded into devices that are used in various consumer products, the trend towards portable products suggests an emphasis on conservation of power. As more devices are needed for memory and logic functions, process scaling poses problems that may result in relatively high leakage currents and therefore high standby power consumption.

Many devices require high performance during normal operating modes and may be implemented with thin gate-oxide transistors to achieve the desired performance levels. However, thin gate-oxide transistors may cause relatively large source-to-drain currents that may be undesirably large during standby power modes.

Many devices require that the state of the memory elements be retained during standby modes. This allows the device to resume operation once the device is returned to normal operating mode.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

In the following description, numerous specific details are set forth. However, embodiments of the invention may be practiced without these specific details. In other instances, well-known circuits, structures and techniques have not been shown in detail in order not to obscure the understanding of this description.

Described herein are circuits and techniques to, during a lower power state, power down combinational logic and to maintain power to storage elements associated with the combinational logic. By powering down the combinational logic gates, leakage current may be reduced and state, or other, values to be used for subsequent operations may be maintained in the storage elements.

Figure 1:
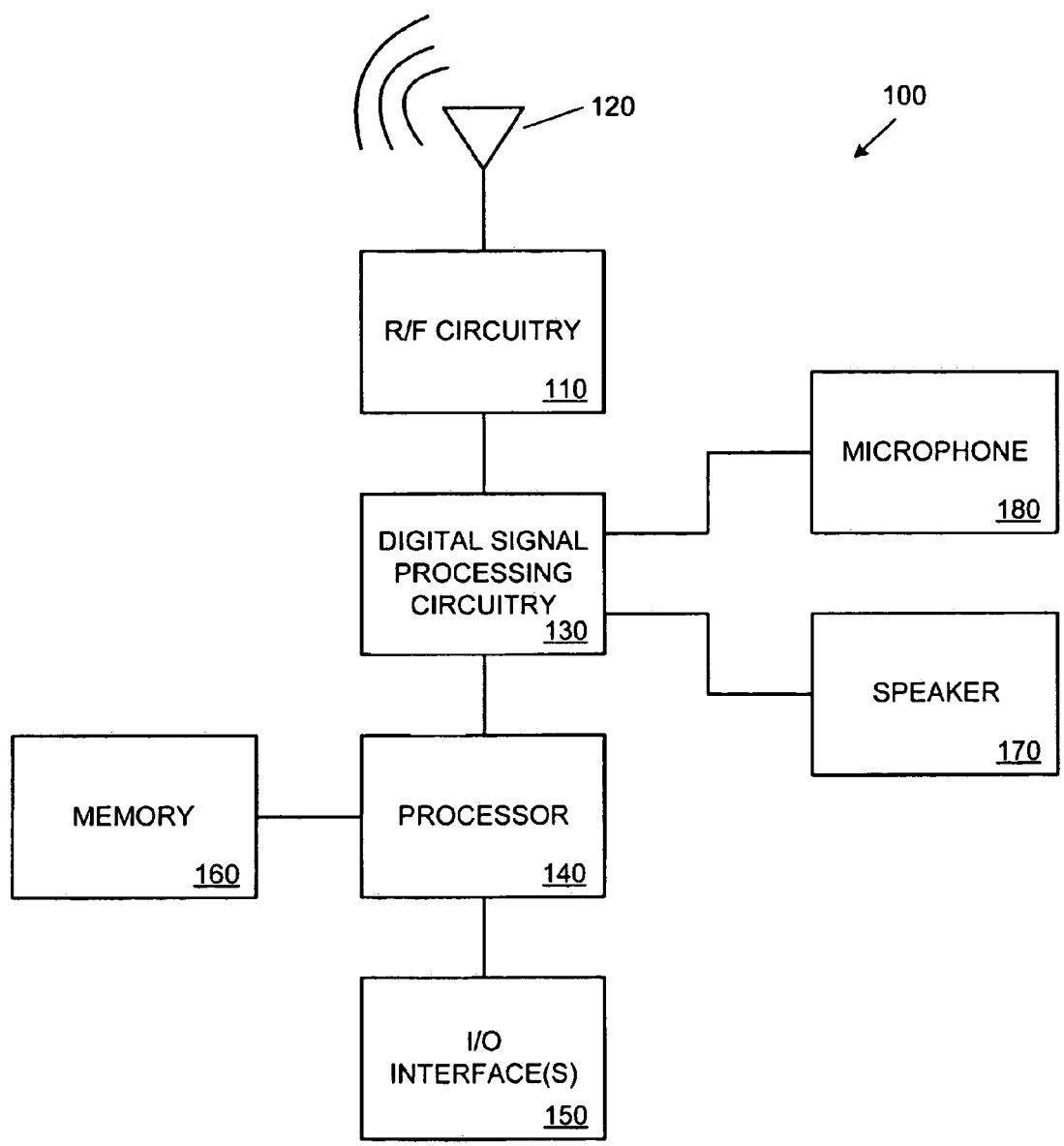
FIG. 1 is a block diagram of one embodiment of a wireless device.

FIG. 1 is a block diagram of one embodiment of a wireless device. A wireless device is only one example of a device in which the relatively low power techniques described herein may be used. Any mobile device, or device in which power conservation is desirable, may utilize the mechanisms and techniques described herein. Wireless device 100 may be any type of wireless device that allows a user to communicate with a remote device using wireless protocols. For example, wireless device 100 can be a cellular telephone, a cellular-enabled personal digital assistant, a cellular-enabled automobile, etc.

In one embodiment, wireless device 100 may include processor 140 that provides processing functionality to support operation of the wireless device. Processor 140 may be coupled with input/output (I/O) interface(s) 150 that allow a user of wireless device 100 to provide and receive information. For example, I/O interface(s) 150 may be coupled with a keypad and/or a display device. Processor 140 may also be coupled with memory 160, which can include dynamic, static, flash and/or any other type of memory. Memory 160 can provide storage for instructions executed by processor 140 as well as data.

In one embodiment, processor 140 may be coupled with digital signal processor (DSP) circuitry 130. DSP circuitry 130 can be any type of DSP circuitry known in the art. DSP circuitry 130 may be coupled with speaker 170 and microphone 180 that may be used in transmitting of voice communications. DSP circuitry 130 may be coupled with radio frequency (R/F) circuitry 110 that may be used in receiving and transmitting radio frequency signals using antenna 120, which can be any type of antenna known in the art, for example, one or more omnidirectional antenna(e).

As will be described in greater detail below, one or more components (e.g., processor 140, DSP circuitry 130) of wireless device 100 may be placed in a low-power state during a period of inactivity. When in the low-power state, certain values may be maintained for use when the component is restored to normal operating conditions. These values may be maintained using the mechanisms and techniques described herein.

Figure 2:
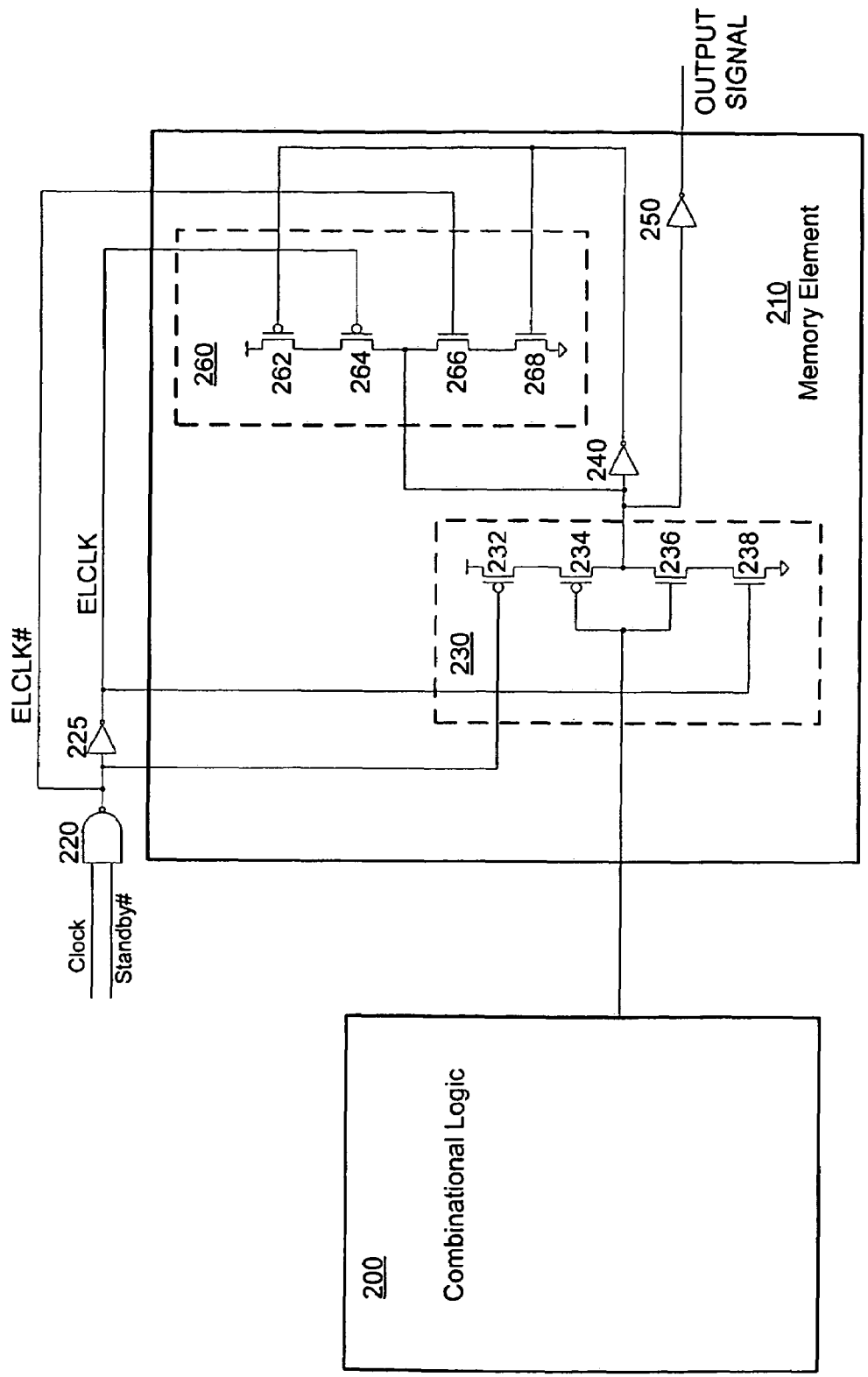
FIG. 2 is a circuit level diagram of a first embodiment of combinational logic and a memory element that may maintain a value when the combinational logic is placed in a low power state.

FIG. 2 is a circuit level diagram of a first embodiment of combinational logic and a memory element that may maintain a value when the combinational logic is placed in a low power state. Combinational logic 200 is intended to represent any type and/or amount of combinational logic that may be included in an integrated circuit. The output signal from combinational logic 200 represents a value to be stored when the component within which combinational logic 200 resides is placed in a low power state.

In one embodiment, a clock signal (labeled "ELCLK#" for element clock) may be provided to memory element 210 by logic gate 220 that receives as input signals a clock signal and a standby signal. In one embodiment, logic gate 220 may be a NAND gate, in which case the output signal generated by logic gate 220 may be an inverted version of the clock input signal when the standby signal is not asserted. In one embodiment, the clock signal provided to memory element 210 is inverted by inverter 225 to provide a signal (labeled "ELCLK" for inverted element clock) that may track the original clock signal. As described in greater detail below, ELCLK and ELCLK# provide signal to control transistors of memory element 210 to maintain a value in memory element 210 when combinational logic 200 is placed in a low power state.

In one embodiment, combinational logic 200 may generate the input signal to memory element 210. The input signal may be applied to the gates of transistors 234 and 236. In one embodiment, transistor 234 may be a p-type transistor and transistor 236 may be an n-type transistor. In one embodiment, transistor 234 may be coupled with transistor 232 that may have a gate coupled to receive the ELCLK# signal from logic gate 220. Similarly, transistor 236 may be coupled with transistor 238 that may have a gate coupled to receive the ELCLK signal from inverter 225. In one embodiment, transistor 232 may be a p-type transistor and transistor 238 may be an n-type transistor.

Transistors 232, 234, 236 and 238 may be referred to as transistor stack 230. Inclusion of transistors 232 and 238 having gates coupled to receive ELCLK# and ELCLK may operate to prevent a direct electrical path between power and ground when the input signal changes states. The output signal from transistor stack 230 may be an inverted version of the input signal. In one embodiment, this signal may be applied as an input signal to inverter 250, the output of which (labeled "output signal") corresponds to the input signal and may be used by other circuitry (not shown in FIG. 2) in the same manner that the input signal to memory element 210 maybe used. As described in greater detail below, memory element 210 may operate to maintain the input signal during a time in which combinational logic 200 is powered down and not maintaining the input signal.

The output signal from inverter 240 may be applied to the gates of transistors 262 and 268. In one embodiment, transistor 262 may be a p-type transistor and transistor 268 may be an n-type transistor. In one embodiment, transistor 262 may be coupled with transistor 264 that may have a gate coupled to receive the ELCLK signal from inverter 225. Similarly, transistor 268 may be coupled with transistor 266 that may have a gate coupled to receive the ELCLK# signal from logic gate 220. In one embodiment, transistor 264 may be a p-type transistor and transistor 266 may be an n-type transistor.

Transistors 262, 264, 266 and 268 may be referred to as transistor stack 260. Inverter 240 and transistor stack 260 together may operate to maintain the input signal to memory element 210. Thus, when combinational logic 200 is powered and operating the value maintained by inverter 240 and transistor stack 260 tracks the input signal. When combinational logic 200 is not powered and operating a value corresponding to the last input signal provided to memory element 210 is maintained by inverter 240 and transistor stack 260.

If combinational logic 200 represents a relatively large block of circuitry, placing combinational logic 200 in a low power state, for example, by disabling a clock signal and/or power source while providing power to memory element 210 may provide significant power savings for an integrated circuit that includes combinational logic 200 and memory element 210. In one embodiment, combinational logic 200 may be a portion of processing circuitry that may generate a value that should be maintained during a low power event. Because memory element 210 does not include thick gate transistors or use of reverse body bias current, memory element 210 may be easier to manufacture than other memory elements.

Figure 3:
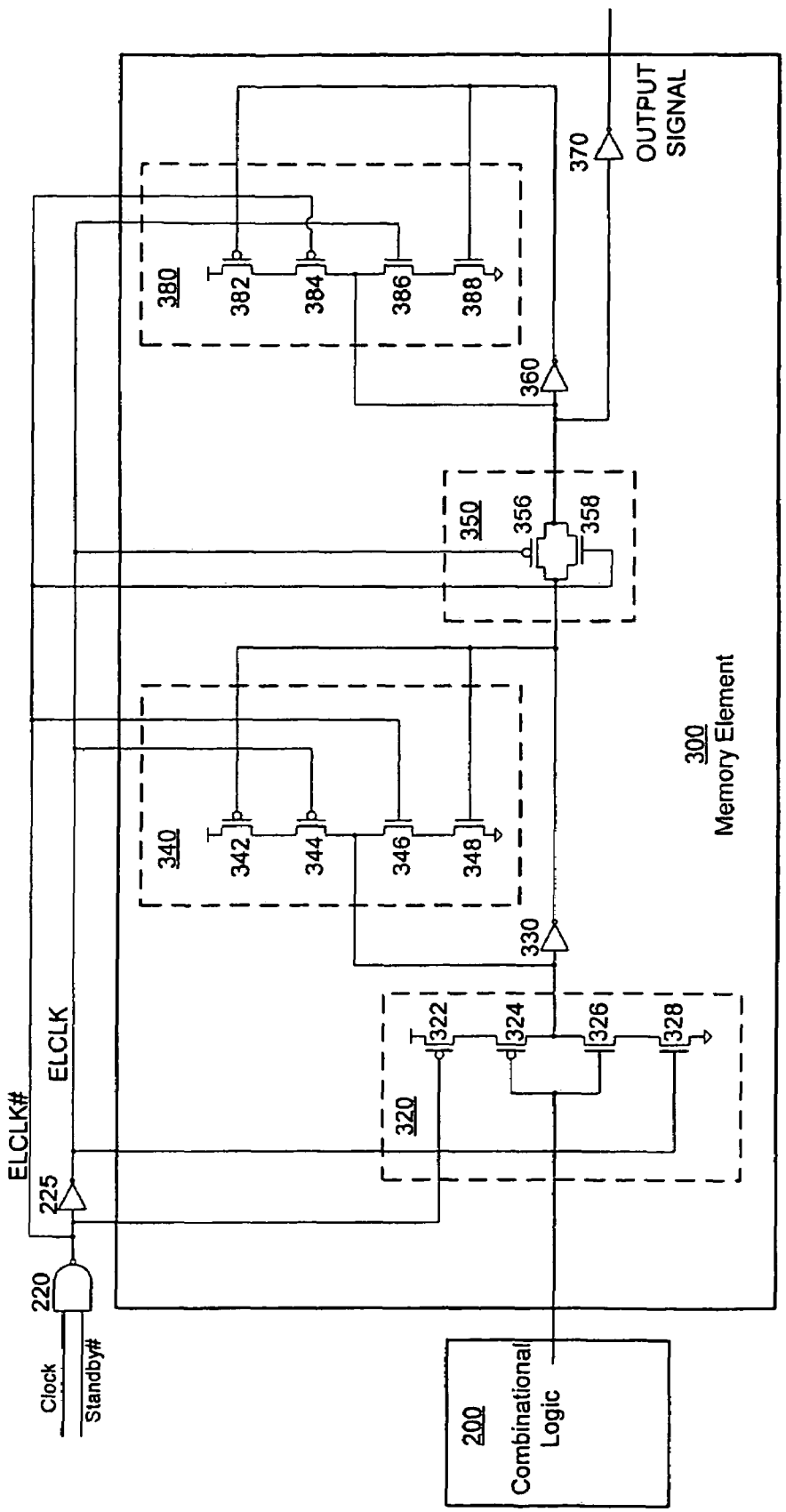
FIG. 3 is a circuit level diagram of a second embodiment of combinational logic and a memory element that may maintain a value when the combinational logic is placed in a low power state.

FIG. 3 is a circuit level diagram of a second embodiment of combinational logic and a memory element that may maintain a value when the combinational logic is placed in a low power state. In one embodiment, memory element 300 may receive an input signal from combinational logic 200, which may be any type of combinational logic as described above. In one embodiment, memory element 300 may include three transistor stacks, three inverters and a pass-gate, the operation of which is described in greater detail below. In one embodiment, the ELCLK and ELCLK# signals are provided as described above with respect to FIG. 2.

In one embodiment, combinational logic 200 may generate the input signal to memory element 300. The input signal may be applied to the gates of transistors 324 and 326. In one embodiment, transistor 324 may be a p-type transistor and transistor 326 may be an n-type transistor. In one embodiment, transistor 324 may be coupled with transistor 322 that may have a gate coupled to receive the ELCLK# signal from logic gate 220. Similarly, transistor 326 may be coupled with transistor 328 that may have a gate coupled to receive the ELCLK signal from inverter 225. In one embodiment, transistor 322 may be a p-type transistor and transistor 328 may be an n-type transistor.

Transistors 322, 324, 326 and 328 may be referred to as transistor stack 320. Inclusion of transistors 232 and 238 having gates coupled to receive ELCLK# and ELCLK may operate to prevent a direct electrical path between power and ground when the input signal changes states. The output signal from transistor stack 320 may be an inverted version of the input signal. In one embodiment, this output signal from transistor stack 320 may be applied as an input signal to inverter 330, the output of which may be provided to transistor stack 340 and to pass gate 350. The input of inverter 330 may also be coupled to receive an output signal from transistor stack 340.

The output signal from inverter 330 may be applied to the gates of transistors 342 and 348. In one embodiment, transistor 342 may be a p-type transistor and transistor 348 may be an n-type transistor. In one embodiment, transistor 342 may be coupled with transistor 344 that may have a gate coupled to receive the ELCLK signal. Similarly, transistor 348 may be coupled with transistor 346 that may have a gate coupled to receive the ELCLK# signal. In one embodiment, transistor 344 may be a p-type transistor and transistor 346 may be an n-type transistor.

Transistors 342, 344, 346 and 348 may be referred to as transistor stack 340. Inverter 330 and transistor stack 340 together may operate to maintain the input signal to memory element 300. Thus, when combinational logic 200 is powered and operating the value maintained by inverter 330 and transistor stack 340 tracks the input signal. When combinational logic 200 is not powered and operating a value corresponding to the last input signal provided to memory element 300 is maintained by inverter 330 and transistor stack 340. The output of inverter 330 may be provided to pass gate 350.

Pass gate 350, which may include transistors 356 and 358, may operate to pass the value stored by inverter 330 and transistor stack 340 to inverter 360 and transistor stack 380. In one embodiment, the gate of transistor 356 may be coupled to receive the ELCLK signal and the gate of transistor 358 may be coupled to receive the ELCLK# signal. In one embodiment, this output signal from pass gate 350 may be applied as an input signal to inverter 360, the output of which may be provided to transistor stack 380. The input of inverter 360 may also be coupled to receive an output signal from transistor stack 380.

The output signal from inverter 360 may be applied to the gates of transistors 382 and 388. In one embodiment, transistor 382 may be a p-type transistor and transistor 388 may be an n-type transistor. In one embodiment, transistor 382 may be coupled with transistor 384 that may have a gate coupled to receive the ELCLK# signal. Similarly, transistor 388 may be coupled with transistor 386 that may have a gate coupled to receive the ELCLK signal. In one embodiment, transistor 384 may be a p-type transistor and transistor 386 may be an n-type transistor.

Transistors 382, 384, 386 and 388 may be referred to as transistor stack 380. Inverter 360 and transistor stack 380 together may operate to maintain the signal output by pass-gate 350. If combinational logic 200 represents a relatively large block of circuitry, placing combinational logic 200 in a low power state, for example, by disabling a clock signal and/or power source while providing power to memory element 300 may provide significant power savings for an integrated circuit that includes combinational logic 200 and memory element 300.

In one embodiment, combinational logic 200 may be a portion of processing circuitry that may generate a value that should be maintained during a low power event. Because memory element 300 does not include thick gate transistors or use of reverse body bias current, memory element 300 may be easier to manufacture than other memory elements.

Figure 4:
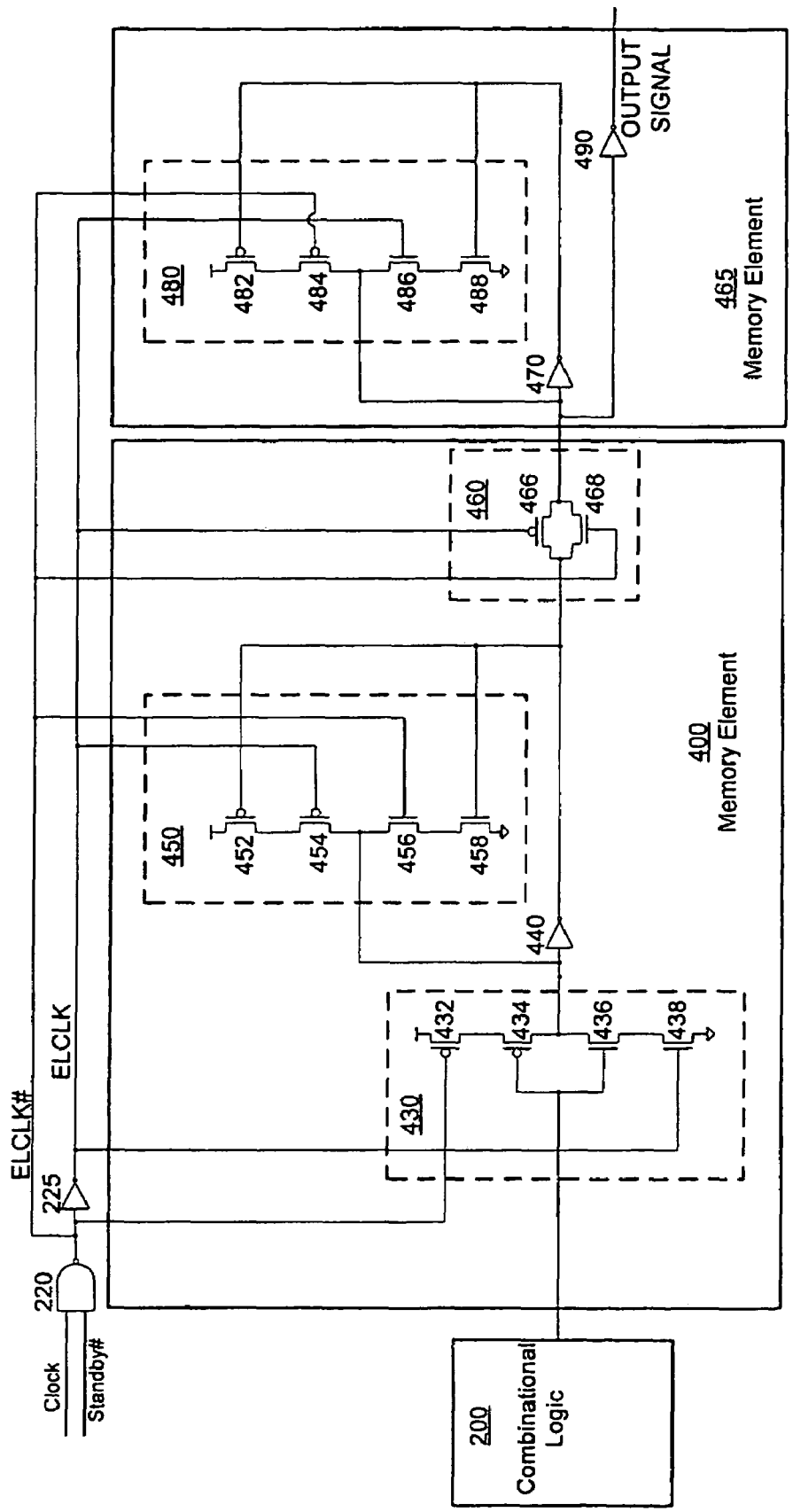
FIG. 4 is a circuit level diagram of a third embodiment of combinational logic and memory elements that may maintain a value when the combinational logic is placed in a low power state.

FIG. 4 is a circuit level diagram of a third embodiment of combinational logic and memory elements that may maintain a value when the combinational logic is placed in a low power state. In one embodiment, memory element 400 may receive an input signal from combinational logic 200, which may be any type of combinational logic as described above. In one embodiment, memory element 400 may include two transistor stacks, an inverters and a pass-gate, the operation of which is described in greater detail below. In one embodiment, the ELCLK and ELCLK# signals are provided as described above with respect to FIG. 2.

In one embodiment, combinational logic 200 may generate the input signal to memory element 400. The input signal may be applied to the gates of transistors 434 and 436. In one embodiment, transistor 434 may be a p-type transistor and transistor 436 may be an n-type transistor. In one embodiment, transistor 434 may be coupled with transistor 432 that may have a gate coupled to receive the ELCLK# signal from logic gate 220. Similarly, transistor 436 may be coupled with transistor 438 that may have a gate coupled to receive the ELCLK signal from inverter 225. In one embodiment, transistor 432 may be a p-type transistor and transistor 438 may be an n-type transistor.

Transistors 432, 434, 436 and 438 may be referred to as transistor stack 430. Inclusion of transistors 432 and 438 having gates coupled to receive ELCLK# and ELCLK may operate to prevent a direct electrical path between power and ground when the input signal changes states. The output signal from transistor stack 430 may be an inverted version of the input signal. In one embodiment, this output signal from transistor stack 430 may be applied as an input signal to inverter 440, the output of which may be provided to transistor stack 450 and to pass gate 460. The input of inverter 440 may also be coupled to receive an output signal from transistor stack 450.

The output signal from inverter 440 may be applied to the gates of transistors 452 and 458. In one embodiment, transistor 452 may be a p-type transistor and transistor 458 may be an n-type transistor. In one embodiment, transistor 452 may be coupled with transistor 454 that may have a gate coupled to receive the ELCLK signal. Similarly, transistor 458 may be coupled with transistor 456 that may have a gate coupled to receive the ELCLK# signal. In one embodiment, transistor 454 may be a p-type transistor and transistor 456 may be an n-type transistor.

Transistors 452, 454, 456 and 458 may be referred to as transistor stack 450. Inverter 440 and transistor stack 450 together may operate to maintain the input signal to memory element 400. Thus, when combinational logic 200 is powered and operating the value maintained by inverter 440 and transistor stack 450 tracks the input signal. When combinational logic 200 is not powered and operating a value corresponding to the last input signal provided to memory element 400 is maintained by inverter 440 and transistor stack 450. The output of inverter 440 may be provided to pass gate 460.

Pass gate 460, which may include transistors 466 and 468, may operate to pass the value stored by inverter 440 and transistor stack 450 to inverter 470. In one embodiment, the gate of transistor 466 may be coupled to receive the ELCLK signal and the gate of transistor 468 may be coupled to receive the ELCLK# signal. In one embodiment, this output signal from pass gate 460 may be applied as an input signal to inverter 470, the output of which may be provided to transistor stack 480.

The output signal from inverter 470 may be applied to the gates of transistors 482 and 488. In one embodiment, transistor 482 may be a p-type transistor and transistor 488 may be an n-type transistor. In one embodiment, transistor 482 may be coupled with transistor 484 that may have a gate coupled to receive the ELCLK# signal. Similarly, transistor 488 may be coupled with transistor 486 that may have a gate coupled to receive the ELCLK signal. In one embodiment, transistor 484 may be a p-type transistor and transistor 486 may be an n-type transistor.

Transistors 482, 484, 486 and 488 may be referred to as transistor stack 480. Inverter 470 and transistor stack 480 together may operate to maintain the signal output by pass-gate 460. In one embodiment, inverter 470 and transistor stack 480 together provide memory element 465, which may be powered down when combinational logic 200 is powered down. Thus, memory element 400 may maintain the stored value when combinational logic 200 and memory element 465 are powered down.

Figure 5:
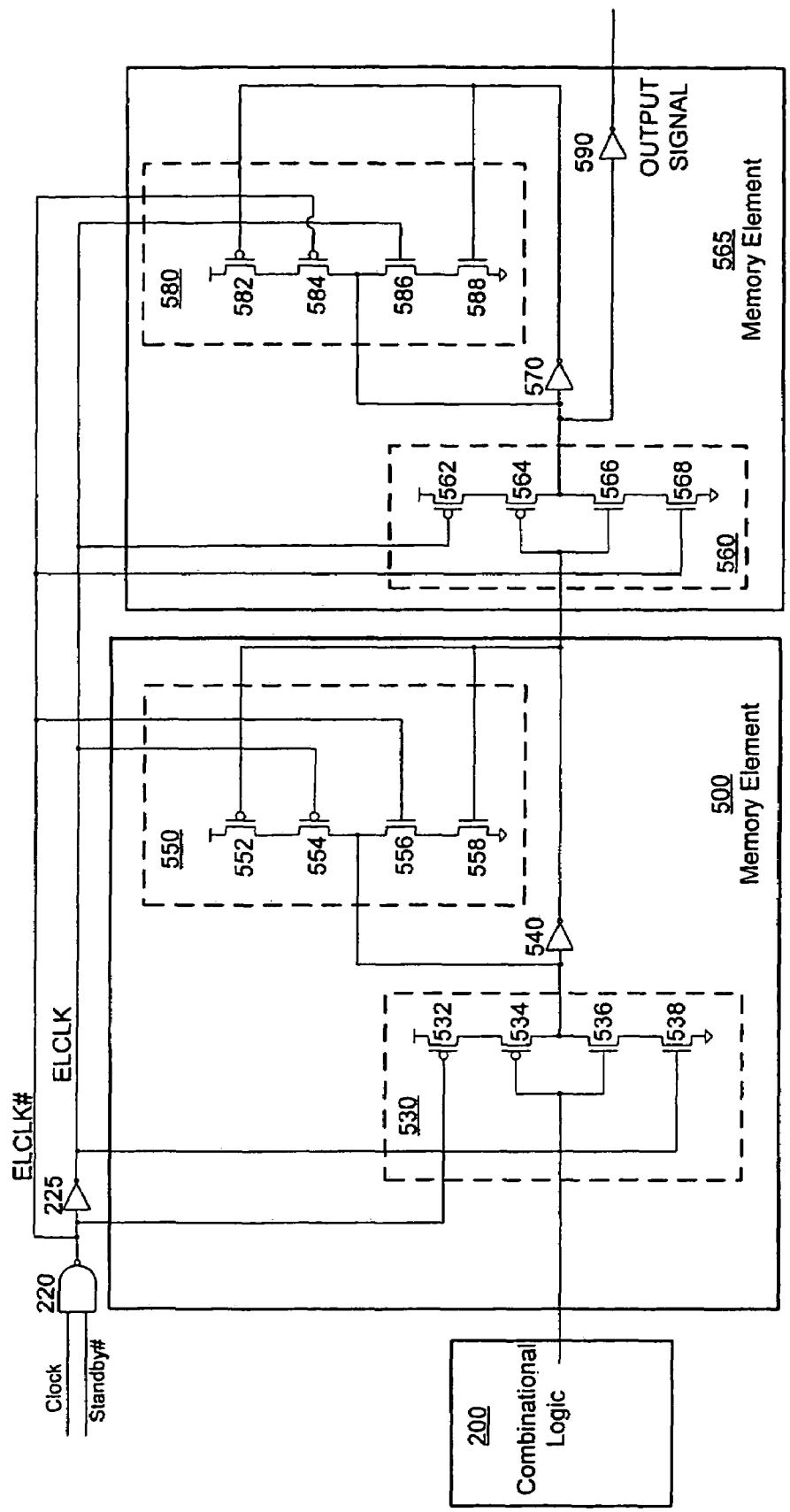
FIG. 5 is a circuit level diagram of a fourth embodiment of combinational logic and a memory element that may maintain a value when the combinational logic is placed in a low power state.

FIG. 5 is a circuit level diagram of a fourth embodiment of combinational logic and a memory element that may maintain a value when the combinational logic is placed in a low power state. In one embodiment, memory element 500 may receive an input signal from combinational logic 200, which may be any type of combinational logic as described above. In one embodiment, the ELCLK and ELCLK# signals are provided as described above with respect to FIG. 2.

In one embodiment, combinational logic 200 may generate the input signal to memory element 500. The input signal may be applied to the gates of transistors 534 and 536. In one embodiment, transistor 534 may be a p-type transistor and transistor 536 may be an n-type transistor. In one embodiment, transistor 534 may be coupled with transistor 532 that may have a gate coupled to receive the ELCLK# signal from logic gate 220. Similarly, transistor 536 may be coupled with transistor 538 that may have a gate coupled to receive the ELCLK signal from inverter 225. In one embodiment, transistor 532 may be a p-type transistor and transistor 538 may be an n-type transistor.

Transistors 532, 534, 536 and 538 may be referred to as transistor stack 530. Inclusion of transistors 532 and 538 having gates coupled to receive ELCLK# and ELCLK may operate to prevent a direct electrical path between power and ground when the input signal changes states. The output signal from transistor stack 530 may be an inverted version of the input signal. In one embodiment, this output signal from transistor stack 530 may be applied as an input signal to inverter 540, the output of which may be provided to transistor stack 550 and to memory element 565. The input of inverter 540 may also be coupled to receive an output signal from transistor stack 550.

The output signal from inverter 540 may be applied to the gates of transistors 552 and 558. In one embodiment, transistor 552 may be a p-type transistor and transistor 558 may be an n-type transistor. In one embodiment, transistor 552 may be coupled with transistor 554 that may have a gate coupled to receive the ELCLK signal. Similarly, transistor 558 may be coupled with transistor 556 that may have a gate coupled to receive the ELCLK# signal. In one embodiment, transistor 554 may be a p-type transistor and transistor 556 may be an n-type transistor.

Transistors 552, 554, 556 and 558 may be referred to as transistor stack 550. Inverter 540 and transistor stack 550 together may operate to maintain the input signal to memory element 500. Thus, when combinational logic 200 is powered and operating the value maintained by inverter 540 and transistor stack 550 tracks the input signal. When combinational logic 200 is not powered and operating a value corresponding to the last input signal provided to memory element 500 is maintained by inverter 540 and transistor stack 550. The output of inverter 540 may be provided to memory element 565.

Memory element 565, which may include transistor stacks 560 and 580 as well as inverters 570 and 590, may operate to store the value output by inverter 540. In one embodiment, the gates of transistors 564 and 566 may be coupled to receive the output signal from inverter 540. In one embodiment, transistor 564 may be a p-type transistor and transistor 566 may be an n-type transistor. In one embodiment, the gate of transistor 562 may be coupled to receive the ELCLK signal and the gate of transistor 568 may be coupled to receive the ELCLK# signal. In one embodiment, the output signal from transistor stack 560 may be applied as an input signal to inverter 570, the output of which may be provided to transistor stack 580. The input of inverter 570 may also be coupled to receive an output signal from transistor stack 580.

The output signal from inverter 570 may be applied to the gates of transistors 582 and 588. In one embodiment, transistor 582 may be a p-type transistor and transistor 588 may be an n-type transistor. In one embodiment, transistor 582 may be coupled with transistor 584 that may have a gate coupled to receive the ELCLK# signal. Similarly, transistor 588 may be coupled with transistor 586 that may have a gate coupled to receive the ELCLK signal. In one embodiment, transistor 584 may be a p-type transistor and transistor 586 may be an n-type transistor.

Inverter 570 and transistor stack 580 together may operate to maintain the signal output by memory element 500. In one embodiment, inverter 570 and transistor stack 580 together provide memory element 565, which may be powered down when combinational logic 200 is powered down. Thus, memory element 500 may maintain the stored value when combinational logic 200 and memory element 565 are powered down.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A circuit comprising:
   a first transistor stack that receives an input signal, a voltage reference, a reference potential, a clock signal and an inverted clock signal, and that generates an output signal that is an inverse of the input signal;
   a first inverter that receives the output signal from the first transistor stack;
   a second transistor stack that receives the voltage reference, the reference potential, the clock signal and the inverted clock signal, and that generates an output signal that is an inverse of an output signal from the first inverter; and
   a pass control circuit that includes first and second transistors,
   wherein first terminals of the first and second transistors are coupled together and receive the output signal of the second transistor stack, control terminals of the first and second transistors receive the clock signal and the inverted clock signal, respectively, and second terminals of the first and second transistors are coupled together and output the output signal of the second transistor stack; and
   a logic circuit that receives an external clock signal and a standby signal, and that generates the clock signal.

2. A circuit, comprising:
   a first transistor stack that receives an input signal, a voltage reference, a reference potential, a clock signal and an inverted clock signal, and that generates an output signal that is an inverse of the input signal;
   a first inverter that receives the output signal from the first transistor stack;
   a second transistor stack that receives the voltage reference, the reference potential, the clock signal and the inverted clock signal, and that generates an output signal that is an inverse of an output signal from the first inverter;
   a pass control circuit that includes first and second transistors,
   wherein first terminals of the first and second transistors are coupled together and receive the output signal of the second transistor stack, control terminals of the first and second transistors receive the clock signal and the inverted clock signal, respectively, and second terminals of the first and second transistors are coupled together and output the output signal of the second transistor stack; and
   a combinational logic circuit that generates the input signal and that is selectively powered down,
   wherein the first transistor stack, the first inverter and the second transistor stack maintain a value of the input signal while the combinational logic is powered down.

3. The circuit of claim 1, wherein the first transistor stack comprises:
   a third transistor including a first terminal that receives the voltage reference, and including a control terminal that receives the inverted clock signal;
   a fourth transistor including a first terminal that communicates with a second terminal of the third transistor, and including a control terminal that receives the input signal;

a fifth transistor including a second terminal that communicates with a second terminal of the fourth transistor, and including a control terminal that receives the input signal; and a sixth transistor including a second terminal that communicates with a first terminal of the fifth transistor, a control terminal that receives the clock signal, and a first terminal that communicates with the reference potential.

4. The circuit of claim 3, wherein the third transistor and the fourth transistor comprise p-type MOS transistors, and the fifth transistor and the sixth transistor comprise n-type MOS transistors.

5. The circuit of claim 3, further comprising:

a second inverter that communicates with the second terminal of the fourth transistor and the second terminal of the fifth transistor, wherein the second inverter receives an output signal from the first transistor stack, and wherein the second inverter generates an output signal.

6. The circuit of claim 1, wherein the second transistor stack comprises:

a third transistor including a first terminal that receives the voltage reference, and including a control terminal that receives the output signal from the first inverter;

a fourth transistor including a first terminal that communicates with a second terminal of the third transistor, and including a control terminal that receives the clock signal;

a fifth transistor including a second terminal that communicates with a second terminal of the fourth transistor, and including a control terminal that receives the inverted clock signal; and a sixth transistor including a second terminal that communicates with a first terminal of the fifth transistor, a control terminal that receives the output signal from the first inverter, and a first terminal that communicates with the reference potential.

7. The circuit of claim 6, wherein the third transistor and the fourth transistor comprise p-type MOS transistors and the fifth transistor and the sixth transistor comprise n-type MOS transistors.

8. The circuit of claim 1, wherein the first and second transistor stacks prevent a direct electrical path between the voltage reference and the reference potential during operation.

9. A wireless device comprising:

an antenna; and a processing device that communicates with the antenna, wherein the processing device comprises the circuit of claim 1.

10. The wireless device of claim 9, wherein the wireless device comprises a cellular telephone, a cellular-enabled personal digital assistant, or a cellular-enabled automobile.

* * * * *